(12) United States Patent
Lee

(10) Patent No.: US 8,808,454 B2
(45) Date of Patent: Aug. 19, 2014

(54) GAS INJECTION UNIT FOR CHEMICAL VAPOR DESPOSITION APPARATUS

(75) Inventor: Jae Moo Lee, Pyeongtaek-si (KR)

(73) Assignee: LIGADP Co., Ltd., Gyeonggi-do (KR)

( * ) Notice: Subject to any disclaimer, the term of this patent is extended or adjusted under 35 U.S.C. 154(b) by 716 days.

(21) Appl. No.: 12/843,604

(22) Filed: Jul. 26, 2010

(65) Prior Publication Data

US 2011/0023782 A1    Feb. 3, 2011

(30) Foreign Application Priority Data

Jul. 28, 2009 (KR) .................. 10-2009-0068833

(51) Int. Cl.
*C23C 16/00* (2006.01)
*C23C 16/455* (2006.01)
*C23F 1/00* (2006.01)
*H01L 21/306* (2006.01)

(52) U.S. Cl.
USPC ...... 118/715; 118/716; 118/724; 156/345.33; 156/345.34; 156/345.37

(58) Field of Classification Search
USPC ........ 118/715, 716, 724; 156/345.33, 345.34, 156/345.37
See application file for complete search history.

(56) References Cited

U.S. PATENT DOCUMENTS 5,155,336 A * 10/1992 Gronet et al. .................. 219/411
5,871,586 A * 2/1999 Crawley et al. ............... 118/715
6,090,210 A * 7/2000 Ballance et al. .............. 118/725
2005/0003600 A1* 1/2005 Kasai et al. ................... 438/200
2008/0017613 A1* 1/2008 Nogami et al. ................. 216/58

FOREIGN PATENT DOCUMENTS

| JP | 05-343331 | | 12/1993 |
| JP | 05343331 A | * | 12/1993 |
| KR | 1020020061714 A | | 7/2002 |
| KR | 1020040017845 A | | 2/2004 |
| KR | 1020040098551 A | | 11/2004 |
| TW | I224815 B | | 12/2004 |

* cited by examiner

*Primary Examiner* — Rakesh Dhingra
*Assistant Examiner* — Benjamin Kendall
(74) *Attorney, Agent, or Firm* — William Park & Associates Patent Ltd.

(57) ABSTRACT

A gas injection unit allows uniform cooling thereof via smooth flow of coolant and can be easily manufactured. The gas injection unit for a chemical vapor deposition apparatus includes, inter alia: a gas distribution housing; a cooling housing positioned between the gas distribution housing and a processing chamber where a deposition process is performed, and formed with a coolant inlet through which coolant is introduced, and a coolant outlet through which the coolant is discharged; a processing gas pipe of which one end is opened to the gas distribution housing and the other end is opened to the processing chamber, the processing gas pipe penetrating the cooling housing; and a first wall part positioned inside the cooling housing such that an inside of the cooling housing is partitioned into a central path and a peripheral path, and formed with a penetration hole such that the central path communicates with the peripheral path.

8 Claims, 4 Drawing Sheets

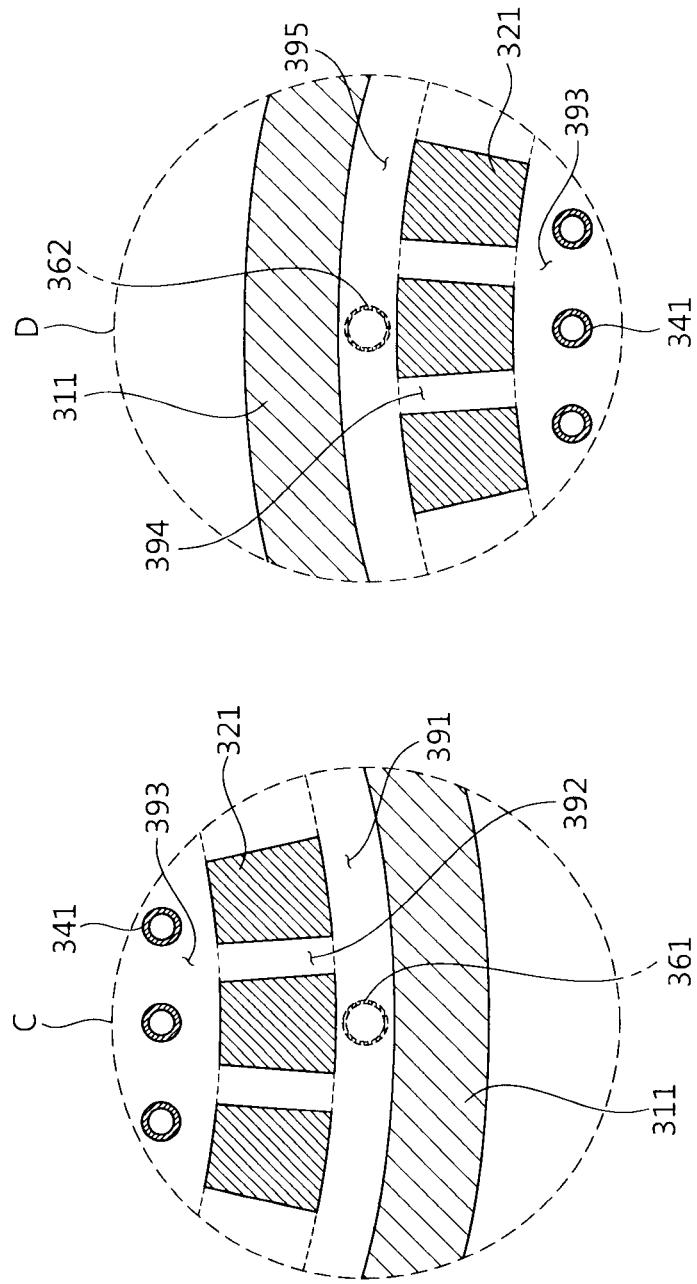

GAS INJECTION UNIT FOR CHEMICAL VAPOR DESPOSITION APPARATUS

CROSS-REFERENCE TO RELATED PATENT APPLICATION

This application claims the benefit of Korean Patent Application No. 10-2009-0068833, filed on Jul. 28, 2009, in the Korean Intellectual Property Office, the disclosure of which is incorporated herein in its entirety by reference.

BACKGROUND OF THE INVENTION

1. Field of the Invention

The present invention relates generally to an apparatus for forming a thin layer on a semiconductor substrate, and more particularly to a gas injection unit for a chemical vapor deposition apparatus.

2. Description of the Related Art

A chemical vapor deposition apparatus is a device used for depositing a thin layer on a semiconductor substrate placed on a susceptor inside a processing chamber of the chemical vapor deposition apparatus by injecting a processing gas therein through a gas injection unit. The gas injection unit is an apparatus for uniformly injecting the processing gas toward the substrate positioned inside the processing chamber.

When the gas injection unit becomes heated above an ideal processing temperature, it may cause an undesirable chemical reaction inside the gas injection unit and cause the unintended reaction by-product to precipitate and attach to the inner surface of the gas injection unit. To prevent this phenomenon, a cooling unit is employed in order to maintain the gas injection unit at a temperature below the predetermined temperature.

Well known cooling units in the related art proposes installation of a separate coolant pipe inside the gas injection unit to provide cooling. However, there are many problems associated with this known technique in view of that the spaces through which the coolant pipe does not pass may not be cooled smoothly and that it would be very difficult to densely install a cooling water pipe. Further, the cooling water pipe itself has limitations largely due to the fact that the pipe would excessively occupy the space.

SUMMARY OF THE INVENTION

A cooling unit maintains the temperature of a gas injection unit at a temperature below a predetermined temperature. A gas injection unit having such a cooling unit is cooled uniformly and allows to be manufactured easily.

According to an aspect of the present invention, a gas injection unit for a chemical vapor deposition apparatus includes: a gas distribution housing; a cooling housing positioned between the gas distribution housing and a processing chamber where a deposition process is performed, and formed with a coolant inlet through which coolant is introduced, and a coolant outlet through which the coolant is discharged; a processing gas pipe of which one end is opened to the gas distribution housing and the other end is opened to the processing chamber, the processing gas pipe penetrating the cooling housing; and a first wall part positioned inside the cooling housing such that an inside of the cooling housing is partitioned into a central path and a peripheral path, and formed with a penetration hole such that the central path communicates with the peripheral path.

According to another aspect of the present invention, a chemical vapor deposition apparatus includes: a processing chamber; a susceptor positioned inside the processing chamber, on which a substrate is loaded; and a gas injection unit injecting a processing gas into an inside of the processing chamber, the gas injection unit including: a gas distribution housing; a cooling housing positioned between the gas distribution housing and the processing chamber, and formed with a coolant inlet through which coolant is introduced, and a coolant outlet through which the coolant is discharged; a processing gas pipe of which one end is opened to the gas distribution housing and the other end is opened to the processing chamber, the processing gas pipe penetrating the cooling housing; and a first wall part positioned inside the cooling housing such that the cooling housing is partitioned into a central path and a peripheral path, and formed with a penetration hole such that the central path communicates with the peripheral path.

According to another aspect of the present invention, a gas injection unit for a chemical vapor deposition apparatus, includes: a first chamber; a second chamber positioned between the first chamber and a processing chamber where a deposition process is performed, and formed with a coolant inlet through which coolant is introduced and a coolant outlet through which the coolant is discharged; a circular tube positioned inside the second chamber to partition an inside of the second chamber into a central path and a peripheral path; and a processing gas pipe of which one end is opened to the first chamber and the other end is opened to the processing chamber, the processing gas pipe penetrating the second chamber, wherein the circular tube is formed with a plurality of penetration holes.

BRIEF DESCRIPTION OF THE DRAWINGS

The above and other features and advantages of the present invention will become more apparent by describing in detail exemplary embodiments thereof with reference to the attached drawings in which:

FIGS. 4A-4B are partially enlarged plane views of the portions C and D of FIG. 3, respectively, of the gas injection unit for the chemical vapor deposition apparatus according to an embodiment of the present invention.

DETAILED DESCRIPTION OF THE INVENTION

Figure 1:
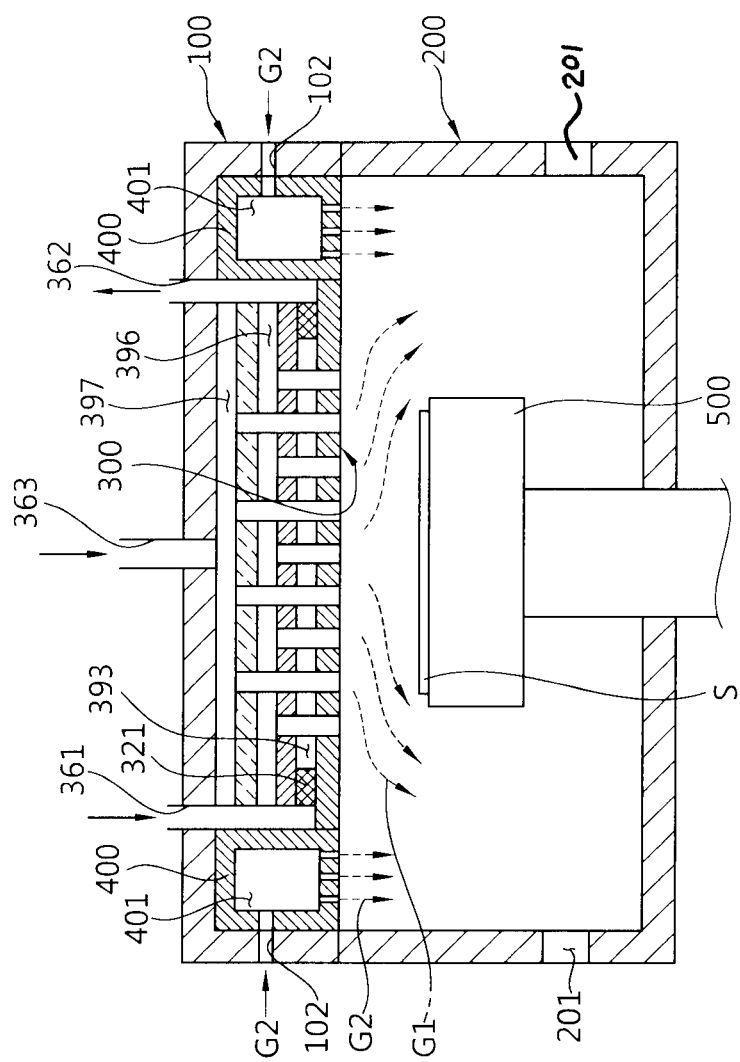
FIG. 1 is a cross-sectional view of a chemical vapor deposition apparatus according to an embodiment of the present invention.

The present invention will now be described more fully with reference to the accompanying drawings, in which exemplary embodiments of the present invention are shown. The present disclosure may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of layers and regions may be exaggerated for clarity of illustration. Like reference numerals in the drawings denote like elements.

FIG. 1 is a schematic cross-sectional view of a chemical vapor deposition apparatus according to an embodiment of the present invention. The present embodiment is applicable to other various chemical vapor deposition apparatuses as well as a general metal-organic chemical vapor deposition (MOCVD) apparatus. It should be understood that FIG. 1 as well as other drawings of the present disclosure are drawn with emphasis to show the elements constituting the chemical vapor deposition apparatus according to an embodiment of the present invention. That is, these figures are not intended to show each and every single element of the chemical vapor deposition apparatus.

As shown in FIG. 1, a lid 100 and a processing chamber 200 are coupled to each other so as to comprise a reaction chamber in which a vapor deposition can be performed. A first gas supply pipe 363, a coolant supply pipe 361, and a coolant discharge pipe 362 are formed through the upper surface of the lid 100.

An inert gas inlet 102 is formed through a side surface of the lid 100 to supply an inert gas G2 to an inert gas chamber 401, and a gas outlet 201 is also formed through a side surface of the processing chamber 200.

A gas injection unit 300 injects a processing gas G1 toward a substrate S placed on a susceptor 500 as a raw material for forming a thin layer on the substrate S.

An inert gas injection unit 400 injects the inert gas G2 from the inert gas chamber 401 into the processing chamber 200 so as to accelerate the discharge of the processing gas G1.

As mentioned above, a substrate S is loaded on the susceptor 500, and a thin layer is thereby formed on the substrate S through the chemical vapor deposition process occurring inside the processing chamber 200. A heater (not shown) may also be provided inside the susceptor 500.

Figure 2:
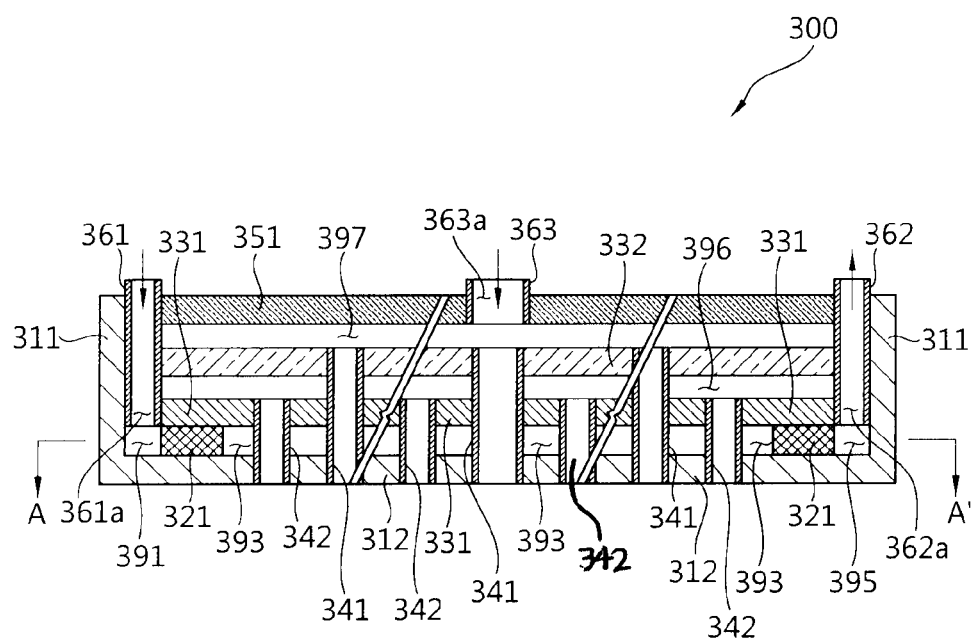
FIG. 2 is a cross-sectional view of a gas injection unit for a chemical vapor deposition apparatus taken along line B-B' of FIG. 3 according to an embodiment of the present invention.

FIG. 2 is a schematic cross-sectional view of the gas injection unit 300 (taken along line B-B' of FIG. 3) for a chemical vapor deposition apparatus according to an embodiment of the present invention.

It is noted that FIG. 2 as well as other drawings of the present disclosure are drawn primarily for the purposes of describing many embodiments of the present invention as such they are not intended to show each and every components of the apparatus. While the actual structure of a gas injection unit for the chemical vapor deposition apparatus according to an embodiment of the present invention could be more complex, FIG. 2 is drawn to highlight, inter alia, the gas and coolant paths according to an embodiment of the present disclosure.

As shown in FIG. 2, the gas injection unit 300 according to an embodiment of the present invention includes a housing comprised of a sidewall 311, a bottom plate 312, and a first plate 351.

A first wall part 321, a second plate 332, a third plate 331, a first gas pipe 341, a second gas pipe 342, a coolant supply pipe 361 and a coolant discharge pipe 362 are provided inside the housing.

The sidewall 311, the first plate 351, and the second plate 332 constitute a first gas distribution housing having a first gas distribution space 397 provided therein such that a first gas is supplied through the first gas supply pipe 363 and distributed to a plurality of first gas pipes 341 into the processing chamber 200.

The sidewall 311, the second plate 332, and the third plate 331 comprise a second gas distribution housing having a second gas distribution space 396 provided therein, such that a second gas is supplied through the second gas supply pipe (not shown in FIG. 2) and distributed to a plurality of second gas pipes 342 into the processing chamber 200.

Although FIG. 2 is drawn to show only two gas distribution spaces (i.e., the first and second gas distribution spaces 397, 396), it would be possible to provide one, three or more or any combination of gas distribution spaces depending, for example, on the type of the chemical vapor deposition apparatus used and/or the kind of gas used.

The second gas distribution space 396 ends up heated directly by the radiant heat delivered from the susceptor 500 (see FIG. 1), unless the second gas distribution space 396 is sufficiently cooled.

As shown in FIG. 2 according to an embodiment of the present invention, a cooling path is provided between the coolant supply pipe 361 and the coolant discharge pipe 362 along a peripheral path 391, a central path 393, and another peripheral path 395 formed below the second gas distribution space 396.

The bottom plate 312 of the gas injection unit 300 comes in direct contact with the space of the processing chamber 200, in which the thin layer is formed on the semiconductor substrate S. The bottom plate 312, the third plate 331, and the sidewall 311 comprise a cooling housing, which provides therein a cooling path along the paths 391, 393, 395.

The sidewall 311 may be formed integrally with the bottom plate 312 or may be provided as a separate member coupled to the bottom plate 312. Or the sidewall 311 may be formed integrally with the inert gas injection unit 400.

The first wall part 321 partitions the cooling path through which coolant flows into the central path 393 and the peripheral paths 391, 395. The first wall part 321 may be formed to a circular tube or ring shape and can be positioned between the bottom plate 312 and the third plate 331. That is, the central path 393 (which is the central portion of the cooling path) is formed in the inner side of the first wall part 321, and the peripheral paths 391, 395 (which are peripheral portions of the cooling path) are formed in the outer side of the first wall part 321. The first wall part 321 may be provided integrally with the bottom plate 312 or as a separate member not integral to the bottom plate 312.

Cooling water may be generally used as the coolant, but other similar fluid such as cooling oil may be used as the coolant.

Figure 3:
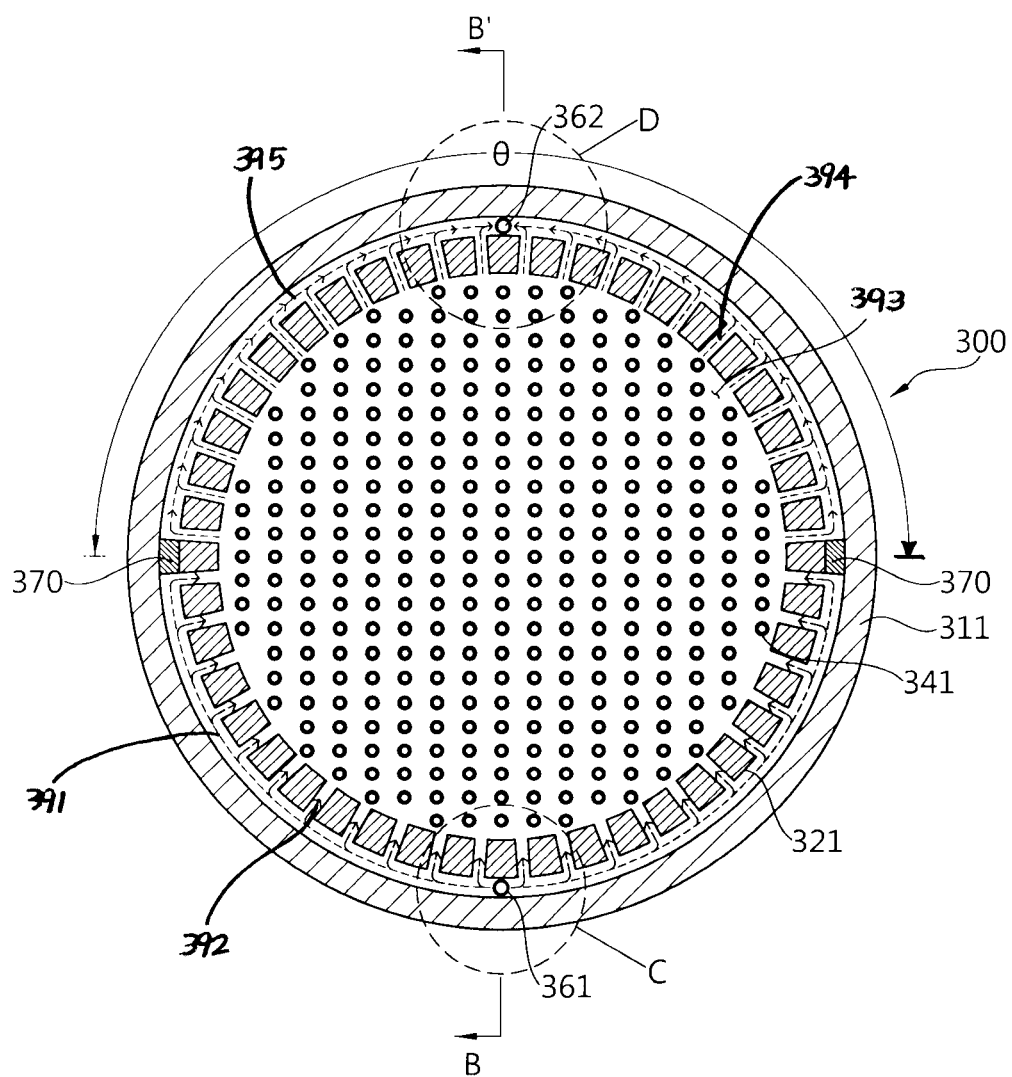
FIG. 3 is a plane view of the gas injection unit for the chemical vapor deposition apparatus taken along direction A-A' of FIG. 2 according to an embodiment of the present invention.

Now referring to FIGS. 3 and 4A-4B, a plurality of first penetration holes 392 and a plurality of second penetration hole 394 may be formed through the first wall part 321 to provide connecting paths between the central path 393 and the peripheral path 391 and between the central path 393 and the second peripheral path 395.

The first gas pipe 341 (see FIG. 2) is installed through the second plate 332 and the bottom plate 312 such that one end of the first gas pipe 341 is opened to the first gas distribution space 397 and the other end is opened to the processing chamber 200. The second gas pipe 342 is installed through the third plate 331 and the bottom plate 312 such that one end of the second gas pipe 342 is opened to the second gas distribution space 396 and the other end is opened to the processing chamber 200.

Therefore, the gas flowing through the first gas pipe 341 and the second gas pipe 342 is sealed from the coolant path such that no gas would leak into the central path 393. Further, the first gas pipe 341 and the second gas pipe 342 are cooled by the coolant flowing through the central path 393.

The coolant supply pipe 361 and the coolant discharge pipe 362 are coupled to the third plate 331. The coolant is supplied to the first peripheral path 391 through a coolant inlet 361a of the coolant supply pipe 361, and is introduced into the central path 393 through the first penetration hole 392 (see FIG. 4) of the first wall part 321. The coolant introduced into the central path 393 is delivered to the second peripheral path 395 through the second penetration hole 394 (see FIG. 4). The coolant delivered to the second peripheral path 395 is discharged to outside through a coolant outlet 362a of the coolant discharge pipe 362.

FIG. 3 is a cross-sectional view of the gas injection unit (taken along the direction A-A' of FIG. 2) for the chemical vapor deposition apparatus according to an embodiment of the present invention. As shown in FIG. 3, the coolant introduced from the coolant supply pipe 361 would flow through the plurality of first penetration holes 392 (as easily seen in FIG. 3 by the coolant flow in dotted line through the first penetration holes 392 between the sidewalls of the first wall part 321) into the central path 393 in the middle. The coolant in the coolant path 393 in the middle portion of FIG. 3 are then flow out through the second penetration hole 394 in into the peripheral path 395 and are discharged through discharge pipe 362.

Now referring back to FIG. 4A-4B, FIG. 4A-4B are partially enlarged plane views of the portions C and D of FIG. 3 of the gas injection unit for the chemical vapor deposition apparatus according to an embodiment of the present invention. The dotted circular shapes of 361, 362 represents the shape of the coolant supply pipe 361, 362, respectively, when each of its position is projected to the bottom. Although the shape of the coolant pipes 361, 362 are shown in a circular shape, the shape according to an embodiment of the present invention is not just limited to this. Other shapes such as oval, rectangular, hexagonal, etc. are also possible for coolant and/or gas supplying/discharge pipes.

Referring back to FIG. 3, the coolant is introduced from the coolant supply pipe 361 into the first peripheral path 391 (also see FIG. 2). The plurality of first gas pipes 341 and the plurality of second gas pipes 342 are densely positioned in the area of the central path 393, and the density of the pipes 341, 242 could be high enough to generate flow resistance of the coolant such that the some parts of the coolant may flow back towards the first peripheral path 391. A second wall part (or a shielding wall) 370 is provided (see left and right side in the middle portion of FIG. 3) to partition the first peripheral path 391 and the second peripheral path 395 such that the second wall part 370 may prevent the coolant from flowing back towards the first peripheral path 391.

The second wall part 370 allows the coolant introduced from the coolant supply pipe 361 to disperse into and throughout the first peripheral path 391 (but not into the second peripheral path 395), from which the coolant flows through the first penetration holes 392 into the central path 393. The coolant then flows out of the first coolant path 393 through the second penetration holes 394 (but not through the first penetration holes 392) into the second peripheral path 395 to be discharged outside through the second peripheral path 395. The coolant flow directions and their paths are shown with dotted lines in FIG. 3 to aid the better understanding.

The coolant passes through the first penetration hole 392 (see FIGS. 3-4) and is introduced into the central path 393 (see FIGS. 2-3). The coolant introduced into the central path 393 cools the first gas pipe 341 and the second gas pipe 342. The coolant then passes through the second penetration hole 394 (see FIGS. 3-4) and is then introduced into the second peripheral path 395 and then discharged outside through the coolant discharge pipe 362.

The two portions of the second wall part 370 as shown in FIG. 3 can be positioned at two places at an angle θ therebetween of 180°. That is, the two portions of the second wall parts 370 as shown in FIG. 3 can be respectively installed at a position of +90° from the coolant inlet 361a and at a position of −90° from the coolant inlet 361a. In other words, the second wall parts 370 may be provided at the positions equally dividing the peripheral path between the coolant inlet 361a and the coolant outlet 362a in half.

The angle θ, however, is not limited to 180°. Nevertheless, the experimental results appear to indicate that coolant flow is smoother when the angle θ between the two portions of the second wall part 370 shown in FIG. 3 is 180° than when the angle θ is 60°.

The first penetration holes 392 and the second penetration holes 394 may number approximately 180 according to an embodiment of the present invention, but not all 180 are shown in the figures of the present disclosure. Likewise, the number of the gas pipes 341, 342 may be 30,000 or more according to an embodiment of the present invention, but not all are drawn in FIG. 3. It should be readily understood that other number of first and second penetration holes 392, 394 and the gas pipes 341, 342 can be formed without departing from the scope of the present disclosure.

The first penetration holes 392 and the second penetration holes 394 may be formed by drilling the side surface of the first wall part 321 with each hole having a diameter of about 7 millimeters. It should also be readily understood that other diameter size of the holes can be drilled without departing from the scope of the present disclosure.

The first penetration hole 392 and the second penetration hole 394 may be formed in a radial shape with respect to a center of the central path 393 for smooth coolant flow.

The inside of the cooling housing is partitioned into the peripheral path 391, 395 and the central path 393 by the first wall part 321, and uniform and smooth coolant flow is formed by the second wall part (or the shielding wall) 370 partitioning the inside of the cooling housing into the first peripheral path 391 and the second peripheral path 395. That is, since the coolant is uniformly introduced from the first peripheral path 391 to the central path 393 through the first penetration holes 392 provided in the radial shape so as to create uniform coolant flow.

According to an embodiment of the present invention, a separate piece of the coolant pipe is not separately installed to the gas injection unit, but the cooling housing which the coolant can flow therein is installed so that the gas pipes penetrate through the cooling housing. This allows manufacturing of the gas injection unit 300 having the cooling unit according to an embodiment of the present invention easier than the conventional way of manufacturing a gas injection mechanism with coolant pipes separately installed thereto.

Also, inside of the cooling housing is partitioned into the peripheral paths 391, 395 and the central path 393 by the first wall part 321, and totally uniform and smooth coolant flow is formed by the second wall part (or shielding wall) 370 partitioning the cooling path into the first peripheral path 391 and the second peripheral path 395. Also, the second wall part 370 is provided to prevent the coolant from bypassing the central path 393 but passing directly through the peripheral path 391 to 395 and discharged.

While embodiments of the present invention have been particularly shown and described with reference to exemplary embodiments thereof, it will be understood by those of ordinary skill in the art that various changes in form and details may be made therein without departing from the spirit and scope of the present invention as defined by the following claims. Therefore, future modifications to the embodiments of the present invention cannot depart from the technical scope of the present invention.

What is claimed is:

1. A chemical vapor deposition apparatus comprising:
   a processing chamber;
   a susceptor capable of being loaded with a substrate thereon inside the processing chamber;
   a gas injection unit injecting a processing gas into an inside of the processing chamber, the gas injection unit comprising:
   a gas distribution housing;
   a cooling housing positioned between the gas distribution housing and a processing chamber where a deposition process is performed, wherein the cooling housing is formed with a coolant inlet through which coolant is introduced and a coolant outlet through which the coolant is discharged;
   a processing gas pipe having one end opened to the gas distribution housing and the other end opened to the processing chamber, wherein the processing gas pipe is formed to penetrate therethrough a portion of the cooling housing;
   a first wall part positioned inside the cooling housing so as to partition the cooling housing into a central path and an annular shaped peripheral path, wherein the first wall part is formed with a plurality of penetration holes providing a path between the central path and the annular shaped peripheral path and,
   a second wall part formed in an outer side of the first wall part at an approximately mid portion of the coolant inlet and the coolant outlet to substantially equally partition the annular shaped peripheral path into (a) an annular shaped first peripheral path bounded at least in part by an interior surface of a sidewall and the outer side of the first wall part, wherein the coolant inlet is located within the annular shaped first peripheral path, and (b) an annular shaped second peripheral path bounded at least in part by the interior surface of the sidewall and the outer side of the first wall part, wherein the coolant outlet is located within the annular shaped second peripheral path, such that coolant is introduced into the annular shaped first peripheral path from the coolant inlet and discharged out of the annular shaped second peripheral path from the coolant outlet,
   wherein the second wall part is positioned in the annular shaped peripheral path such that the coolant introduced from the coolant inlet is substantially prevented from discharging to the coolant outlet without being introduced into the central path;
   wherein a portion of the plurality of penetration holes forms a connecting path through which the coolant is introduced from the annular shaped first peripheral path into the central path and the remaining portion of the plurality of penetration holes forms a connecting path through which the coolant is exited from the central path into the annular shaped second peripheral path so as to be discharged.

2. The chemical vapor deposition apparatus of claim 1, wherein the coolant inlet and the coolant outlet are formed in the peripheral path.

3. The chemical vapor deposition apparatus of claim 1, wherein the processing gas pipe penetrates the central path of the cooling housing.

4. The chemical vapor deposition apparatus of claim 1, wherein the plurality of penetration holes are formed in a radial direction from the center of the central path.

5. A gas injection unit for a chemical vapor deposition apparatus, comprising:
   a gas distribution housing;
   a cooling housing positioned between the gas distribution housing and a processing chamber where a deposition process is performed, wherein the cooling housing is formed with a coolant inlet through which coolant is introduced and a coolant outlet through which the coolant is discharged;
   a processing gas pipe having one end opened to the gas distribution housing and the other end opened to the processing chamber, wherein the processing gas pipe is formed to penetrate therethrough a portion of the cooling housing;
   a first wall part positioned inside the cooling housing so as to partition the cooling housing into a central path and an annular shaped peripheral path, wherein the first wall part is formed with a plurality of penetration holes providing a path between the central path and the annular shaped peripheral path and,
   a second wall part formed in an outer side of the first wall part at an approximately mid portion of the coolant inlet and the coolant outlet to substantially equally partition the annular shaped peripheral path into (a) an annular shaped first peripheral path bounded at least in part by an interior surface of a sidewall and the outer side of the first wall part, wherein the coolant inlet is located within the annular shaped first peripheral path, and (b) an annular shaped second peripheral path bounded at least in part by the interior surface of the sidewall and the outer side of the first wall part, wherein the coolant outlet is located within the annular shaped second peripheral path, such that coolant is introduced into the annular shaped first peripheral path from the coolant inlet and discharged out of the annular shaped second peripheral path from the coolant outlet,
   wherein the second wall part is positioned in the annular shaped peripheral path such that the coolant introduced from the coolant inlet is substantially prevented from discharging to the coolant outlet without being introduced into the central path;
   wherein a portion of the plurality of penetration holes forms a connecting path through which the coolant is introduced from the annular shaped first peripheral path into the central path and the remaining portion of the plurality of penetration holes forms a connecting path through which the coolant is exited from the central path into the annular shaped second peripheral path so as to be discharged.

6. The gas injection unit of claim 5, wherein the coolant inlet and the coolant outlet are formed in the peripheral path.

7. The gas injection unit of claim 5, wherein the processing gas pipe penetrates the central path of the cooling housing.

8. The gas injection unit of claim 5, wherein the plurality of penetration holes are formed in a radial direction from the center of the central path.

* * * * *